United States Patent
Pidwerbecki et al.

(10) Patent No.: US 9,226,428 B2
(45) Date of Patent: Dec. 29, 2015

(54) HIGH HEAT CAPACITY ELECTRONIC COMPONENTS AND METHODS FOR FABRICATING

(75) Inventors: David Pidwerbecki, Hillsboro, OR (US); Alexander B. Uan-Zo-li, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 8 days.

(21) Appl. No.: 13/535,751

(22) Filed: Jun. 28, 2012

(65) Prior Publication Data

US 2014/0002998 A1 Jan. 2, 2014

(51) Int. Cl.
| | |
|---|---|
| *H05K 7/20* | (2006.01) |
| *H05K 3/30* | (2006.01) |
| *B21D 53/02* | (2006.01) |
| *H01L 23/373* | (2006.01) |
| *H01L 23/427* | (2006.01) |
| *G06F 1/16* | (2006.01) |
| *G06F 1/20* | (2006.01) |
| *H05K 1/02* | (2006.01) |
| *H05K 3/28* | (2006.01) |
| *C09K 5/18* | (2006.01) |

(52) U.S. Cl.
CPC .............. *H05K 7/2039* (2013.01); *B21D 53/02* (2013.01); *G06F 1/1656* (2013.01); *G06F 1/203* (2013.01); *H01L 23/3737* (2013.01); *H01L 23/427* (2013.01); *H05K 1/0209* (2013.01); *H05K 3/284* (2013.01); *H05K 3/30* (2013.01); *H01L 2924/0002* (2013.01); *Y10T 29/4935* (2015.01); *Y10T 29/49146* (2015.01)

(58) Field of Classification Search
CPC ......... H05K 7/20; H05K 7/2039; H05K 3/30; H05K 5/02; B21D 53/02; C09K 5/18; G06F 1/20; H01L 23/36; H01L 23/3128
USPC ....................... 361/679.46, 679.54, 700–714, 361/715–722; 165/80.2, 80.3, 80.4, 80.5, 165/104.33, 185, 10, 902; 257/706–727, 257/783, 795, 659, 687; 428/327, 403, 332, 428/913, 320.2, 402.21, 402; 524/439, 440, 524/588, 404, 413, 424; 523/440, 443; 438/106–118
See application file for complete search history.

(56) References Cited

U.S. PATENT DOCUMENTS

| | | | | |
|---|---|---|---|---|
| 4,003,426 | A | * | 1/1977 | Best et al. ....................... 165/53 |
| 4,915,167 | A | * | 4/1990 | Altoz ............................ 165/185 |
| 5,007,478 | A | * | 4/1991 | Sengupta ........................ 165/10 |
| 5,224,356 | A | * | 7/1993 | Colvin et al. ................. 62/259.2 |

(Continued)

FOREIGN PATENT DOCUMENTS

| | | | | | |
|---|---|---|---|---|---|
| EP | 1542281 | A | * | 8/2003 | ............ H01L 23/373 |
| JP | 410107190 | A | * | 4/1998 | .............. H01L 23/36 |

(Continued)

*Primary Examiner* — Michail V Datskovskiy
(74) *Attorney, Agent, or Firm* — Kacvinsky Daisak Bluni PLLC

(57) ABSTRACT

An apparatus may include an electrical component body, where the electrical component body is operative to vary power during operation. The apparatus may also include a thermal component in contact with at least a portion of the electrical component body, in which the thermal component comprises a matrix material, and a thermal energy storage material embedded in the matrix material to absorb heat generated by the electrical component body. Other embodiments are disclosed and claimed.

27 Claims, 10 Drawing Sheets

(56) References Cited

U.S. PATENT DOCUMENTS

| | | | |
|---|---|---|---|
| 5,315,154 A * | 5/1994 | Elwell | 257/707 |
| 5,455,458 A * | 10/1995 | Quon et al. | 257/714 |
| 5,709,945 A * | 1/1998 | Lee et al. | 428/403 |
| 5,804,297 A * | 9/1998 | Colvin et al. | 428/327 |
| 6,200,681 B1 * | 3/2001 | Jahns et al. | 428/402.24 |
| 6,317,321 B1 * | 11/2001 | Fitch et al. | 361/700 |
| 6,321,734 B1 * | 11/2001 | Kaminaga et al. | 123/634 |
| 6,387,482 B1 * | 5/2002 | Persiani et al. | 428/327 |
| 6,399,149 B1 * | 6/2002 | Klett et al. | 427/230 |
| 6,621,702 B2 * | 9/2003 | Elias et al. | 361/700 |
| 6,703,128 B2 * | 3/2004 | Myers et al. | 428/403 |
| 6,848,500 B1 * | 2/2005 | Langari et al. | 165/104.33 |
| 7,002,800 B2 * | 2/2006 | Elias et al. | 361/700 |
| 7,316,262 B1 * | 1/2008 | Rini et al. | 165/10 |
| 7,498,376 B2 * | 3/2009 | Myers et al. | 524/487 |
| 7,701,074 B2 * | 4/2010 | Condie et al. | 257/789 |
| 7,781,900 B2 * | 8/2010 | Carmona et al. | 257/789 |
| 8,130,496 B2 * | 3/2012 | Dong et al. | 361/700 |
| 8,937,384 B2 * | 1/2015 | Bao et al. | 257/714 |
| 9,024,434 B2 * | 5/2015 | Im et al. | 257/712 |
| 2003/0152764 A1 * | 8/2003 | Bunyan et al. | 428/328 |
| 2003/0157342 A1 * | 8/2003 | Myers et al. | 428/447 |
| 2003/0158294 A1 * | 8/2003 | Chaudhuri et al. | 523/205 |
| 2008/0099187 A1 * | 5/2008 | Rini et al. | 165/104.17 |
| 2009/0169983 A1 * | 7/2009 | Kumar et al. | 429/120 |
| 2009/0308571 A1 * | 12/2009 | Thompson et al. | 165/79 |
| 2010/0038053 A1 * | 2/2010 | Maxik et al. | 165/80.2 |
| 2011/0259544 A1 * | 10/2011 | Neti et al. | 165/10 |
| 2012/0040166 A1 * | 2/2012 | Livschits et al. | 428/221 |
| 2012/0280382 A1 * | 11/2012 | Im et al. | 257/712 |
| 2013/0245147 A1 * | 9/2013 | Altmann et al. | 521/143 |

FOREIGN PATENT DOCUMENTS

| | | | | |
|---|---|---|---|---|
| JP | 2001308242 A | * | 11/2001 | H01L 23/42 |
| JP | 02004292483 A | * | 10/2004 | C09K 5/06 |
| JP | 2009273983 A | * | 11/2009 | B05D 3/02 |
| JP | 02011052076 A | * | 3/2011 | C08G 61/08 |

* cited by examiner

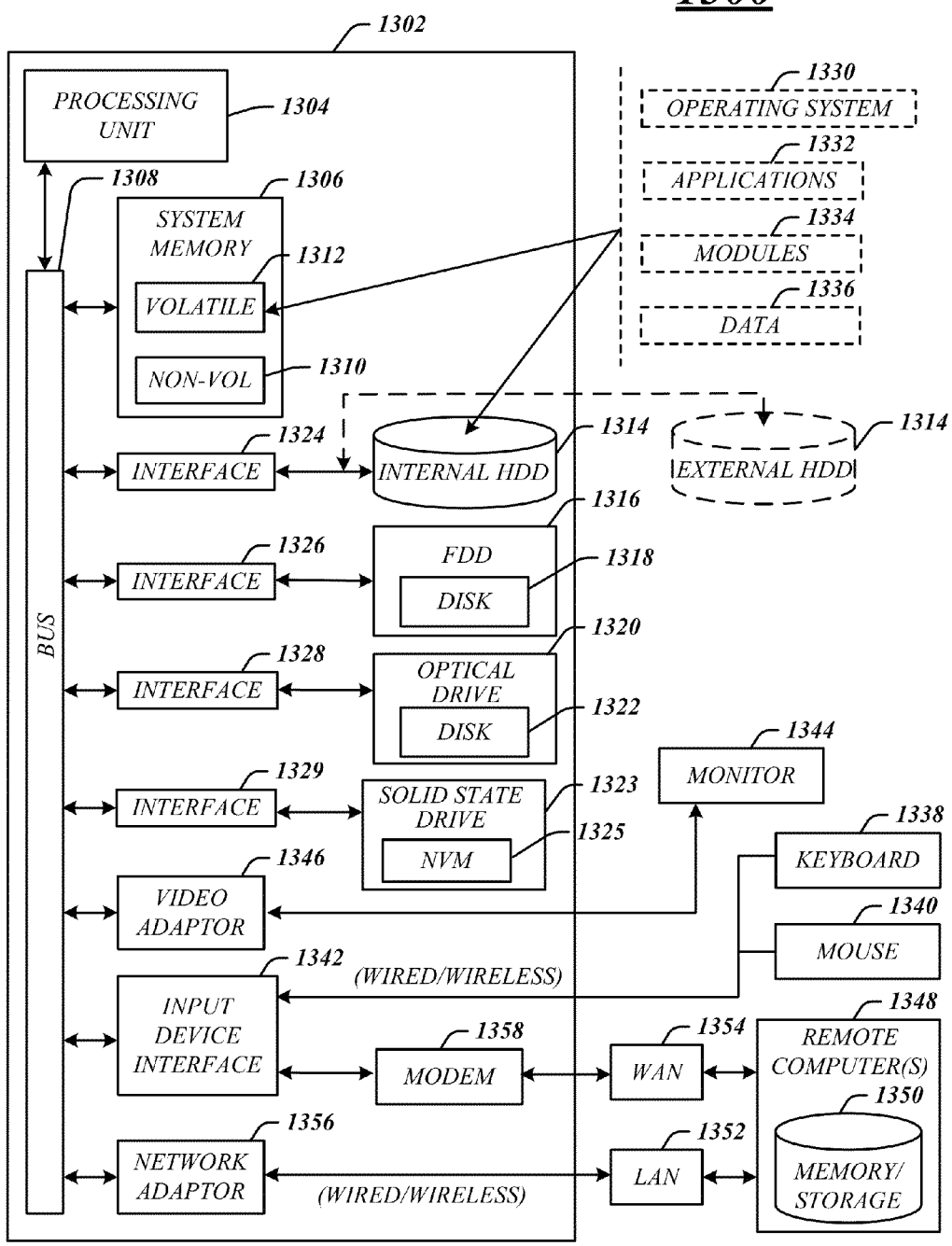

HIGH HEAT CAPACITY ELECTRONIC COMPONENTS AND METHODS FOR FABRICATING

BACKGROUND

Mobile computing devices such as smart phones, tablet personal computers or ultra-mobile personal computers continue to evolve into computing devices that include more power intensive electrical components. These more power-intensive electrical components such as multi-core processors, graphics processors or system-on-a-chip combinations may not only be power intensive but may generate significant amounts of thermal energy during operation. In particular, microprocessors and the supporting electronic components in desktop and mobile computing devices may generate waste heat that can limit and/or impair the performance of the microprocessors and electronics.

The problem of excess heat generation during operation of electronic components may be exacerbated by recently implemented technology that may act to increase heat generation from a device or set of devices occasionally or sporadically. For example, to enhance the customer computing experience technologies have recently been deployed to vary the operating frequency of an electronic processor such as a central processing unit (CPU) to enable high performance computing when required. The short "bursts" of the operating frequency may give a user the impression of a very high-performance computing system while maintaining operation of the electronic components and overall computing system within designed thermal limits. These bursts of frequency can result in the computer exhibiting a responsiveness in performance to the user that may be referred to as "snappiness." Although it may be desirable to further increase the frequency burst duration and/or operating frequency in such short bursts of performance, the large currents generated by the processor and components supporting the processor, such as onboard power supplies, may overheat, which may affect either the individual processor components, supporting connecting board material, and/or the Voltage regulator [VR], among other components.

One manner of accommodating this operation is to provide oversized components to support the short bursts of high processor frequency in order to help dissipate the concomitant large thermal transients caused by high frequency operation. Another way to address this problem is to simply limit the duration of the high frequency excursions, which duration may be limited to the duration for the various components that are affected by the high frequency operation to reach a design or threshold temperature. Other techniques to mitigate the increased heating include the providing of fans for convective cooling. However, the degree of convective cooling is dependent upon the surface area, air velocity, air properties, and the absolute temperature difference of the components from the ambient. Radiant transport has also been employed to cool devices, but the radiant transport is also dependent upon the device surface area, surface irradiative properties, and temperature difference from the environment.

All of the aforementioned approaches to accommodating the bursts of high frequency operation may incur undesirable consequences. For one, the use of oversized components to absorb heat adds to component and system cost, especially for power supplies and voltage regulators, and expends more energy at normal operating frequencies of a CPU, which leads to decreased battery life for mobile computing devices. Moreover, the use of fans to provide cooling is costly and consumes significant amounts of energy, thereby increasing material costs and decreasing battery life. High volumetric flow fans can also cause unacceptable noise to be generated and thereby place stringent demands on the mechanical, electronic and industrial designs of systems to accommodate such fans. In addition, radiant transport to provide component/system cooling is generally small (relative to the conductive and convective transport) at the typical operating temperatures required by electronic components.

Accordingly, there may be a need for improved techniques and apparatus to solve these and other problems.

BRIEF DESCRIPTION OF THE DRAWINGS

FIG. 13 illustrates an example system.

DETAILED DESCRIPTION

Figure 1A:
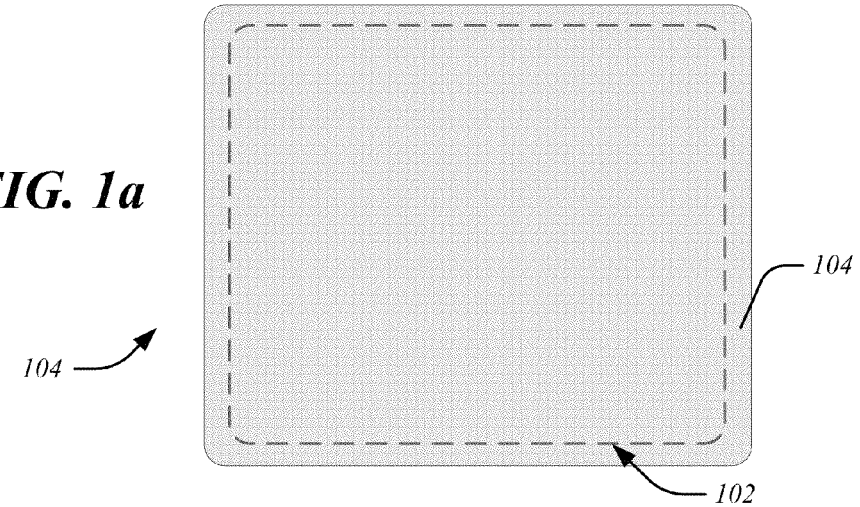
FIGS. 1a and 1b illustrate an example component.

As contemplated in the present disclosure, use of oversized components or cooling fans may be undesirable to address thermal transient problems incurred by the occasional performance bursts required by a given system or application. In various embodiments, these thermal transients are mitigated by modification of components that do not require the addition of fans or the need to scale up the size of a component.

In some embodiments, an electrical component includes an electrical component body and a thermal component that is joined to the electrical component either as a thermal coating of the electrical component or as a thermal package that is connected or mounted to the electrical component. Accordingly, the thermal component such as a thermal coating contacts the electrical component body to provide superior thermal capacitance, heat conduction, convection, and radiant transport from the electrical component. Examples of electrical components include processors, transistors, inductors, and other devices that may consume variable amounts of power and may generate varying amounts of heat. In some examples, the thermal coating may be applied as a liquid to an electrical component body, which may be a processor or other device as noted. The thermal coating may be, for example, a thermoset material such as an integrated circuit (IC)-grade epoxy that solidifies after being applied to the electrical component body.

The term "thermal coating" as used herein generally refers to a material that is applied and adheres to a body, such as a processor or other electrical component, and is operative to change the thermal properties of the electrical component, such as the aforementioned thermal properties. The term "thermal component" as used herein refers to a material that is coupled to the electrical component and is operative to change the thermal properties of the electrical component, whether as a package to which the electrical component is mounted or as a thermal coating.

In particular embodiments, the thermal coating may modify the thermal time constant of the electrical component such that the time required to reach a given temperature during operation of the electrical component is longer than in the case where the thermal coating is not applied to the electrical component body. As a result, the electrical components of the present embodiments may perform in an enhanced mode for a given duration, such as in a "Turbo" mode where processor speed is increased, without incurring overheating beyond a design limit. This may thereby facilitate longer periods of Turbo mode operation for a given electrical component.

In additional embodiments, smaller, more power-efficient (at light load) electrical components may be designed to take advantage of the increased thermal time constant provided by the thermal coatings.

Consistent with the present embodiments, the thermal coating may have a composite structure that includes a matrix material such as an epoxy, and a microencapsulated energy storage material such as a micro phase change material (mPCM) that is dispersed within the matrix material. The micro phase change material may be an organic material operative to undergo a phase transformation at a design temperature that is within a range of temperature to be generated by the electrical component body during operation. The micro phase change material may thereby impart a relatively higher heat capacity to the thermal coating over a temperature range incurred during operation of the electrical component, such that the time to reach a design temperature increases.

In accordance with the present embodiments, the thermal coating may have properties such as low electrical conductivity, low coefficient of thermal expansion, high energy storage capability, better thermal conductivity, high emissivity (black) coloring, and low viscosity and low surface tension during application, which thereby imparts excellent wetting capabilities that allow the thermal coating to wick into small voids.

In alternative embodiments, the thermal coating is applied to an electrical component body when mounted in a package or when unmounted in a package. The term "electrical component body" as used herein refers to that portion of an electrical component other than the thermal coating. Thus, an electrical component arranged according to the present embodiments may include an electrical component body and a thermal coating applied to the electrical component body. In some embodiments, the electrical components may be surface-mounted devices, while in other embodiments the electrical components may be pin-mounted devices.

In particular embodiments, the thermal coating may include curing agents that incorporate either thermal curing agents, ultraviolet radiation curing agents, or both. In some embodiments, the curing agents may be arranged to provide a "skin" cure that facilitates short cycle time manufacturing (for example 5 seconds). In other embodiments, the curing agents may be arranged to provide longer term thermal cures in order to minimize cure induced stresses. The latter curing agents may be used, for example, when it is desired to use the thermal coatings in conjunction with sensitive surface mount components where stress levels may be minimized by providing a thermal coating that does not cause undue thermal expansion stresses during temperature cycling. stress levels should allow use on sensitive surface mount components and not cause undue thermal expansion stresses during temperature cycling.

In other embodiments, rather than applying a thermal coating to an electrical component body, an electrical component body may be mounted on a thermal component such as a package component that is made from a composite, in which the composite comprises a matrix such as an epoxy, and an energy storage material such as a micro phase change material (mPCM) that is dispersed within the matrix material.

In still other embodiments a thermal coating or package component to be mounted to an electrical component body may form a composite structure including a matrix material such as an epoxy and an micro dispersed energy storage material, where the micro-dispersed energy storage material is dispersed within the matrix material without being encapsulated.

Figure 1B:
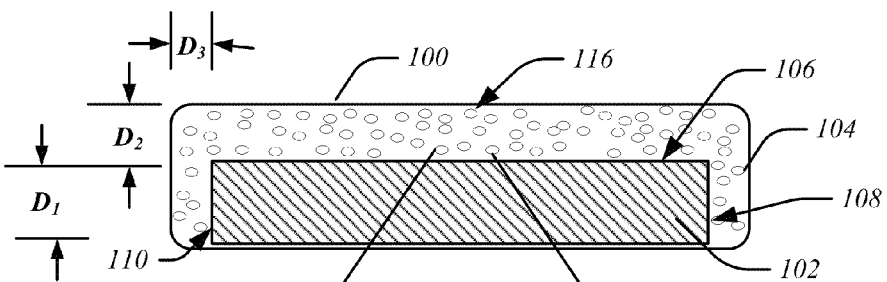

FIG. 1a and FIG. 1b illustrate an exemplary electrical component 100. As shown in the top view depicted in FIG. 1a, electrical component 100 includes an electrical component body 102, which may contain various components such as circuitry and electrical/electronic devices. In various embodiments, the electrical component body 102 may be an electronic processor, microprocessor, combination of circuits, circuit elements (e.g., transistors, resistors, capacitors, inductors, and so forth), integrated circuits, application specific integrated circuits (ASIC), programmable logic devices (PLD), power transistors and diodes, magnetic components, capacitors, digital signal processors (DSP), field programmable gate array (FPGA), memory units, logic gates, registers, semiconductor device, chips, microchips, chip sets, and so forth. The electrical component body may function as a central processing unit (CPU), graphics processing unit (GPU), volatile of non-volatile memory including solid state memory, a power device including a power transistor, and so forth. The embodiments are not limited in this context.

The electrical component 100 further includes a thermal coating 104, which may contact at least a portion of the electrical component body 102. In some embodiments, the thermal coating 104 may coat one or more surfaces of the electrical component body 102, such as the surface 106, 108, and 110 of electrical component body 102 as illustrated in the side cross-sectional view of FIG. 1b. Also, as shown in FIG. 1b, thermal coating 104 includes a matrix material 112 and a thermal energy storage material that is dispersed as particles within the matrix material 112. In some embodiments the thermal energy storage material may be microscopic particles that constitute an uncoated phase change material, such as a wax. In other embodiments, the thermal energy storage material may be a microencapsulated phase change material that constitutes particles in which a core contains a material such as a wax and a coating contains a second material that surrounds and encapsulates the core. For the purposes of illustration, in the FIGs. to follow, embodiments of a thermal coating 104 are depicted in which a microencapsulated phase change material (mPCM) 114 is dispersed within the matrix material 112. Expanded view 120 in FIG. 1b depicts a close-up view of several particles of the mPCM 114.

The term "microencapsulated" as used herein, refers to a material that is arranged in the form of small particles in which an inner portion of a particle is a material that is encased by an outer portion, or encapsulant. Thus, a microencapsulated phase change material may constitute multiple small particles that contain phase change material encased by a coating or shell, which may be a second material. The term "phase change material" as used herein, may generally refer to a material that is operative to undergo a phase change in a temperature range to be encountered during use of the electrical component coated by a thermal coating as detailed below. Likewise, a microencapsulated energy storage material may constitute multiple small particles that contain an inner portion that comprises an energy storage material which may be encased by a coating or shell, which may be a second material. An energy storage material may be a material that stores heat, for example, by having a high heat capacity over a designed temperature range, which high heat capacity may be produced by a phase transformation that takes place in the energy storage material in the designed temperature range. In the present embodiments, the size of the particles may vary, but may generally be smaller than 1 mm in size. In this manner the particles may more easily disperse within coatings that may have a thickness in the range of tens of microns to several millimeters.

In some examples, as further described below, mPCM 114 may be embedded and dispersed within the matrix material 112 and may serve as a thermal energy storage material to absorb heat generated by elements of the electrical component 100. In various embodiments, thermal energy storage materials that might be used to absorb heat and possibly later release the heat include waxes (such as paraffin wax, octadecane, eicosane, docosane, etc.), vegetable extracts, polyethylene glycol, hydrated salts (such as Glauber's salt), fatty acids, esters, ionic liquids or certain polymers. These and other materials may be mixed to achieve different properties. In some examples, the thermal energy storage material may be a phase change material that is selected so that the thermal energy storage material experiences a phase change at a temperature typically generated by an electrical component body 102 during operation, which temperature, in some embodiments, may range between 3° C. and 120° C. Phase changes for mPCM 114 may include solid-liquid transitions, solid-gas transitions, liquid-gas transitions, solid-solid transitions, and liquid-liquid transitions—although some of these phase changes, such as a liquid-gas transition, might not be practical to maintain a conformal coating such as thermal coating 104 without degradation after a phase change.

In various embodiments, the mPCM 114 may be designed according to one or more characteristics of the electrical component body 102. The characteristics of the electrical component body 102 that may guide design of the mPCM 114 include, among other factors, power generated under normal mode of operation of devices of the electrical component body 102; physical dimensions of the electrical component body 102; power generated during operation in an enhanced mode, such as operation of electronic circuitry at high frequency and/or higher voltage; and packaging environment of the electrical component 100, such as whether and/or how the electrical component is affixed to a printed circuit board or other element during operation. One or more of these characteristics may directly affect the temperature range experienced by the electrical component body 102 during operation, such as in the enhanced mode.

In embodiments in which the electrical component body 102 is formed from a semiconductor substrate, the electrical component body 102 may have the generally flat, rectangular shape characteristic of a semiconductor "chip." Typical thickness $D_1$ (see FIG. 1b) may range between several hundred micrometers to one millimeter or more, and lateral dimensions may be in the range of a few millimeters to several centimeters. In various embodiments, the thermal coating 104 may be applied to the electrical component body 102 to form a thermal coating having a thickness $D_2$ that is about several hundred micrometers to several millimeters, so that a total thickness of the electrical component 100 is about one millimeter to several millimeters. In various embodiments, the thermal coating 104 may also extend to cover side regions of the electrical component body 102 to a thickness $D_3$ that may be less than, equal to, or greater than $D_2$. However, the embodiments are not limited in this context.

As depicted further in FIG. 1b, mPCM 114 may be embedded in the matrix material 112 as multiple microscopic particles. In some embodiments, the size of the particles is smaller than the thickness dimension(s) of the thermal coating 104, such as $D_2$ and $D_3$. In this manner, the particles that constitute the microencapsulated PCM 114 may be more uniformly distributed within the matrix material 112. For example, in some embodiments the particle size of the microencapsulated PCM 114 may be about one micrometer to about several hundred micrometers, and more particularly several micrometers to several tens of micrometers.

Consistent with various embodiments, the mPCM 114 comprises multiple particles where each particle includes a relatively more thermally stable encapsulant (not separately shown) that covers and retains an inner portion (also not shown) of a particle, where the inner portion is operative to undergo a phase transition such as a melting transition at a temperature that may lie within a temperature range in which an electrical component to be coated operates. However, because the encapsulant portion of each particle of the mPCM 114 is relatively more thermally stable, the inner portion of each particle may melt during operation of the electrical component without melting the outer, encapsulant, portion. In this manner the thermal coating 104 may be reversibly cycled through multiple temperature cycles in which during a heating phase, the melting temperature of the inner portion of the particle is exceeded, and during a cooling phase, the temperature of the particle falls below the freezing temperature of the inner portion, such that the inner portion solidifies. Advantageously, this thermal cycling of mPCM 114 that is dispersed within the thermal coating may take place without adversely changing the overall shape, size, and dispersion of the thermal coating 104. Although the inner portion of the mPCM may change in volume by several percent when undergoing a phase transformation, the encapsulation within the matrix material 112 may minimize the overall change in volume. In this manner, the thermal coating 104 may undergo multiple thermal cycles caused by, for example, operation of the electrical component in an enhance mode, without incurring undue stress or changes in the performance of the thermal coating 104.

In other embodiments, instead of providing a microencapsulation to a phase change material, a thermal energy storage material may constitute a phase change material that is dispersed similarly to microencapsulated PCM 114, that is, may be "micro dispersed" within the matrix material 112, without however, being encapsulated. For example, a low melting temperature wax material may be dispersed as isolated particles that may have diameters of several micrometers, tens of micrometers, or hundreds of micrometers. The matrix material 112 may be a high temperature epoxy that remains rigid at the melting temperature of the dispersed wax particles, such that the wax particles may reversibly undergo melting and freezing phase transformation processes without significant distortion of the overall composite coating.

Figure 2:
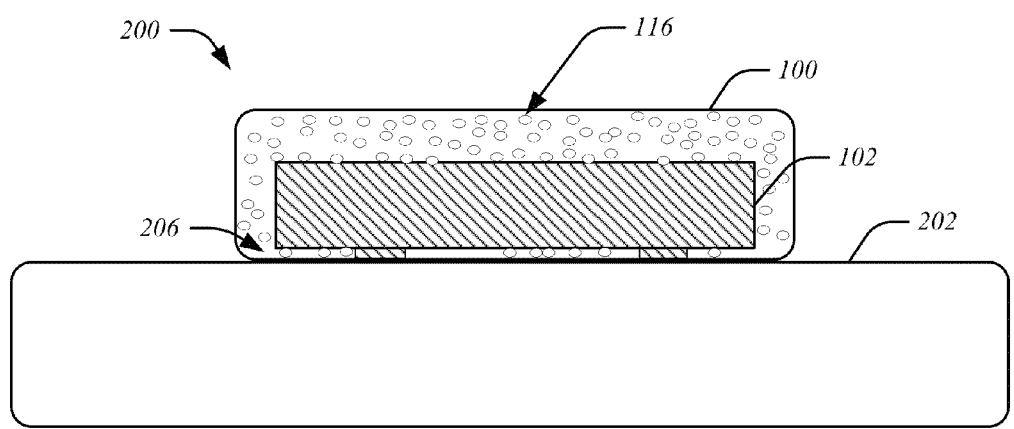
FIG. 2 illustrates an example system.

In various embodiments, in operation, the electrical component 100 may be mounted on another component, as noted above. FIG. 2 illustrates a system 200 that includes the electrical component 100, which is affixed to a packaging component 202. In some embodiments, the packaging component may be a printed circuit board (PCB) such as an electronic "motherboard" or other PCB.

Referring again to FIG. 1b, in various embodiments, the matrix material 112 may be a material that can be conveniently applied in liquid form to cover the electrical component body 102. In some examples, the matrix material 112 may be a polymeric material that has a softening temperature, a melting temperature, or a decomposition temperature above the temperature in which the electrical component 100 is to be operated, thereby maintaining stability of the electrical component. In particular embodiments, the matrix material 112 may be a thermoset material, such as an epoxy. The term "thermoset" as used herein, refers to a material system that is operable to undergo an irreversible curing process. In some examples, the thermoset material may include a polymer-based material that may include, but is not limited to, plastics, rubbers or epoxies. It is to be noted that the term thermoset does not imply that the thermoset material can be cured only by thermal means. Rather, it will be appreciated that a thermoset may be cured using ultraviolet radiation, heat, or a combination of ultraviolet radiation and heat, to name some examples.

For example, an epoxy polymeric material may be formed from two or more precursors that may include an epoxide "resin" and a polyamine "hardener," both of which may be in the form of a liquid when mixed together. In this manner, the matrix material 112 when applied to the electrical component body 102 may have the properties of a liquid and may subsequently undergo or complete a curing process that renders the matrix material 112 as a solid. A property of thermoset materials such as epoxy is that, once solidified, the thermoset material cannot be remelted and instead undergoes a decomposition reaction if heated to elevated temperatures. However, many known electronic grade epoxy materials are thermally stable up to 100° C., 200° C., 300° C., or higher. Accordingly, in embodiments in which matrix material 112 is an epoxy, the electrical component may be reversibly cycled through temperatures in excess of 100° C. without adversely affecting the thermal coating 104.

Figure 1B:
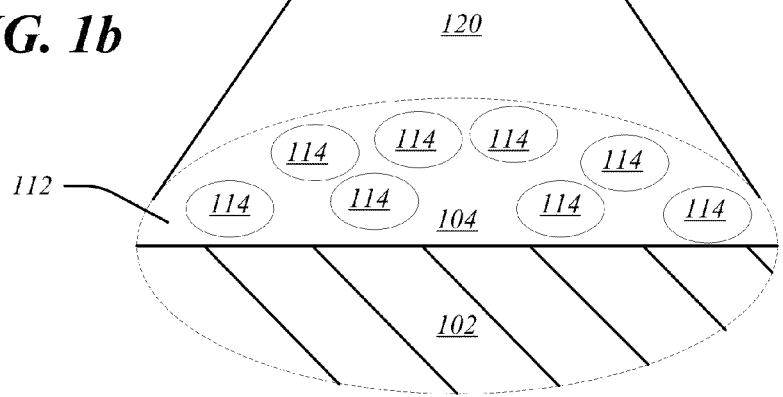

As previously noted, the thermal coating of the present embodiments, such as thermal coating 104, may be applied as a liquid form that has sufficient wetting properties to fill small voids. This may be particularly useful when applying the thermal coating, to an electrical component body that has small structures. Although not specifically depicted in FIGS. 1 and 2, it is to be noted that the electrical component 100 and/or packaging component 202 may include elements on their respective surfaces (see, e.g., surface 106), such as electrical devices, conductive wiring, connectors, and other features that render their surfaces non-planar including the interface region 206 between the electrical component 100 and packaging component 202. However, during application of the thermal coating 104, the thermal coating 104 may exhibit sufficient flow, sufficiently low surface tension, and sufficiently good wetting properties to the surface of components to be covered that any small cavities defined by small structures are filled. As illustrated in FIG. 2, the thermal coating 104 may thereby encapsulate the electrical component body.

After application and curing, the outer surface 116 of the thermal coating 104 may serve as a ruggedized outer surface that may encase or protect electrical components such as electrical component body 102 from ambient chemical attack and/or mechanical perturbations.

In operation, when an electrical component 100 is powered, during a "normal" state of operation, the electrical component 100 may generate power within a range such that the temperature of the electrical component 100 and/or other components proximate the does not exceed design limits for the electrical component 100 and/or other components that are arranged proximate the electrical component 100. For example a transistor device or processor circuit that is designed to operate at a first clock frequency during normal operation mode may generate heat from operation at the first clock frequency that is dissipated without causing the temperature of the electrical component 100 to exceed the design limit. The electrical component 100 may also be operative to perform, at least for a given period of time, in an enhanced mode in which the clock frequency of the processor circuit increases to a second clock frequency beyond that of the normal operation mode.

During operation in the enhanced mode, at least a portion of heat generated by the electrical component 100 may flow into the thermal coating 104, thereby causing the temperature of the thermal coating 104 to increase. As the temperature of thermal coating 104 rises, the temperature may approach the melting temperature of the mPCM 114. When the temperature of thermal coating 104 is sufficient to reach the melting temperature of (the inner portion of the particles of) mPCM 114, heat generated by the electrical component 100 may be absorbed by the mPCM 114 in order to cause it to melt. As is known, the melting of a material involves an endothermic reaction in which heat is added or absorbed by the melting material from its surroundings. During the melting of a material heat absorbed from the surroundings may transform the material from a solid phase to a liquid phase without causing a change in overall temperature of the material. Neglecting the thermal properties of the outer portion of the particles, the mPCM 114 may be characterized by a latent heat of fusion (melting) of its inner component, which refers to the amount of heat, usually expressed as a function of mass of the material, required to melt the material. During the melting process, the temperature of the matrix surrounding the mPCM 114, as well as the adjacent electrical component body, may remain constant or the rate of temperature increase may slow, because the heat that would otherwise generate a temperature increase flows into the mPCM 114 to cause the melting.

In accordance with various embodiments, the inner component of particles of the mPCM 114 may be a higher order alkane material, in which the number of carbon atoms is sufficient to impart a melting temperature above room temperature (20° C.). For example, the number of carbon atoms may exceed 18 in an alkane material to be used as an inner (melting) component of the mPCM 114. In one example, the inner component may be docosane, $C_{22}H_{46}$. In some examples, the latent heat of fusion of the inner (melting) component of the mPCM 114 may be about 200 kJ/kg up to 285 kJ/kg, for example in the case of waxes that are solid at room temperature and above. Accordingly, for each kilogram of the mPCM 114 incorporated into a thermal coating 104 (without accounting for the outer component of the particles, which does not undergo a phase transition at the planned use temperatures of the thermal coating), heat output from electrical component 100 may exceed 200 kJ before the inner component of the particles that constitute mPCM 114 is melted.

For some examples, the percentage of mPCM 114 per weight compared to the total thermal coating 104 (or "weight percent PCM") may range from a few percentages to higher than 50 percent. It is to be noted that a relatively higher weight percent PCM, such as above 20 percent, may be desirable to more effectively absorb the heat output from an electrical component body 102. In this manner, the thermal time constant of an electrical component having a thermal coating 104 applied may increase by a factor of two or more over the case in which no thermal coating is applied.

In this manner, for the above example, an embodiment of the thermal coating 104 may employ a mPCM 114 that is designed to melt at a range of temperature that results when the electrical component body 102 is placed in enhanced mode of operation. The mPCM 114 may thereby protect the electrical component body 102 and/or other proximate devices from overheating for significant time by absorbing heat generated during operation of the electrical component body 102 when the melting temperature of the mPCM 114 is reached. Once the inner (melting) component of the particles of mPCM 114 have melted, additional heat generated by the electrical component 100 during operation in the enhanced mode may result in an increase in temperature of the electrical component 100 and other proximate components in accordance with the heat capacity of the components.

It is to be noted that the above example does not take into account heat conductivity of various components, as well as other channels for heat dissipation including convection. Thus, when heat is generated by the electrical component body 102, thermal gradients may exist in the electrical component 100 such that melting of the mPCM 114 is spread out over an apparent temperature range. Nevertheless, the mPCM 114 may serve to increase the duration for which an electrical component body can operate in an enhanced mode by providing a material that absorbs heat via an induced phase transition, thereby increasing the effective heat capacity over a range of temperature such that the rate of temperature rise is reduced. This may be expressed as an increase in a thermal time constant for an electrical component that may be operating in the enhanced mode that generates unwanted heat. Advantageously, the enhanced mode of operation of an electrical component may be designed according to the enhanced thermal time constant afforded by the present embodiments. Such an enhanced thermal time constant device provides multiple benefits including extending the duration of enhanced mode operation and providing flexibility to design smaller devices that can operate for similar duration as larger devices that do not have the thermal coating.

Figure 3:
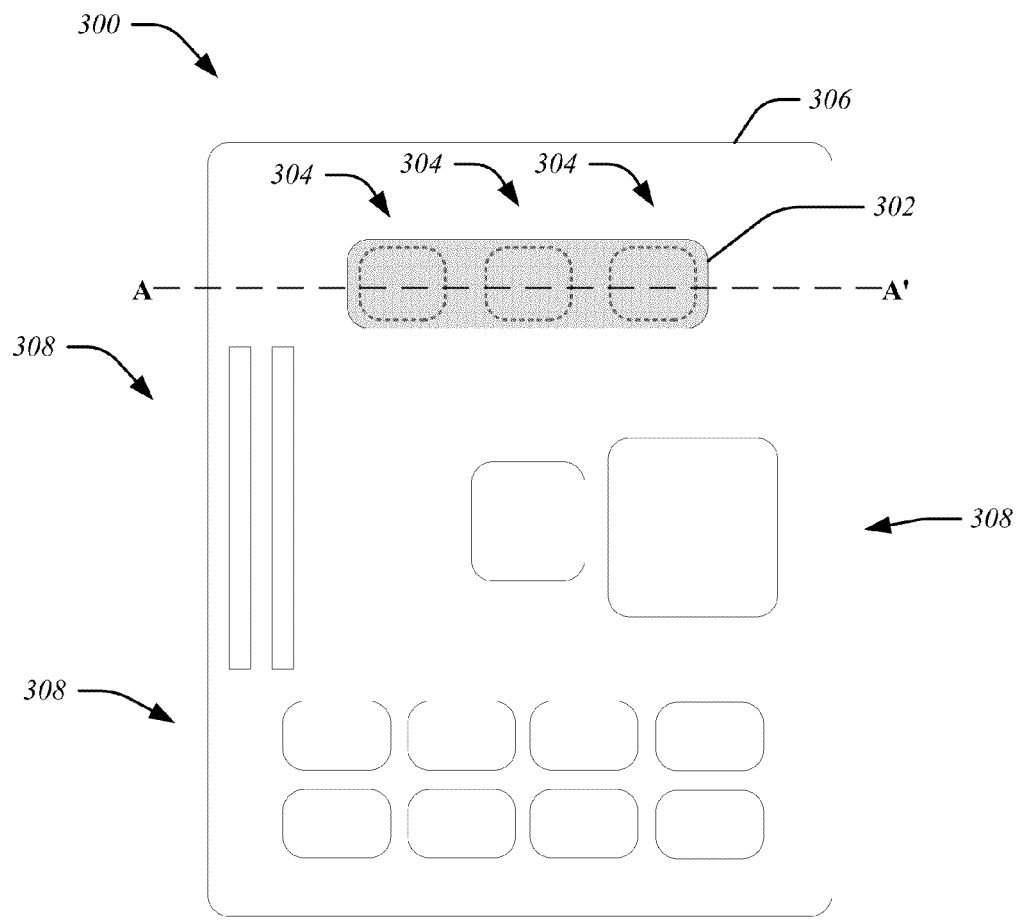
FIG. 3 illustrates a top plan view of an example system.
Figure 4:
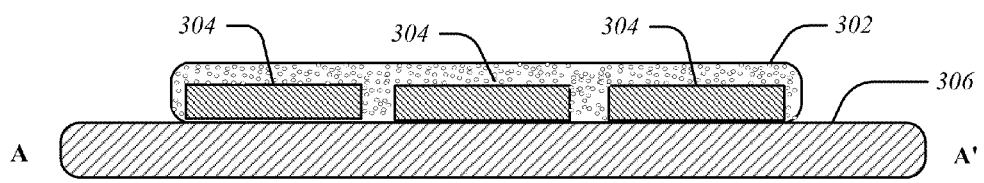
FIG. 4 illustrates a side cross-sectional view of the system of FIG. 3.

FIG. 3 depicts in a top plan view an exemplary system 300 that includes multiple electrical components 304 that are each covered by a thermal coating 302. FIG. 4 depicts a side cross-sectional view of the system 300 along the direction A-A'. The electrical components 304 may each be a similar device, or may differ among themselves. In accordance with various embodiments, the thermal coating 302 may be applied individually to each electrical device 304 or may be applied as a single coating that extends over multiple electrical components 304. The system 300 may include a printed circuit board 306 and various other electrical components 308, which may include a CPU, GPU, memory device, and other known components. In various embodiments, a thermal coating 304 may be applied to any of electrical components 304 or 308 in order to act to mitigate temperature increase due to operation of the electrical component, such as when the electrical component operates in an enhanced mode where increased power is drawn.

Figure 5:
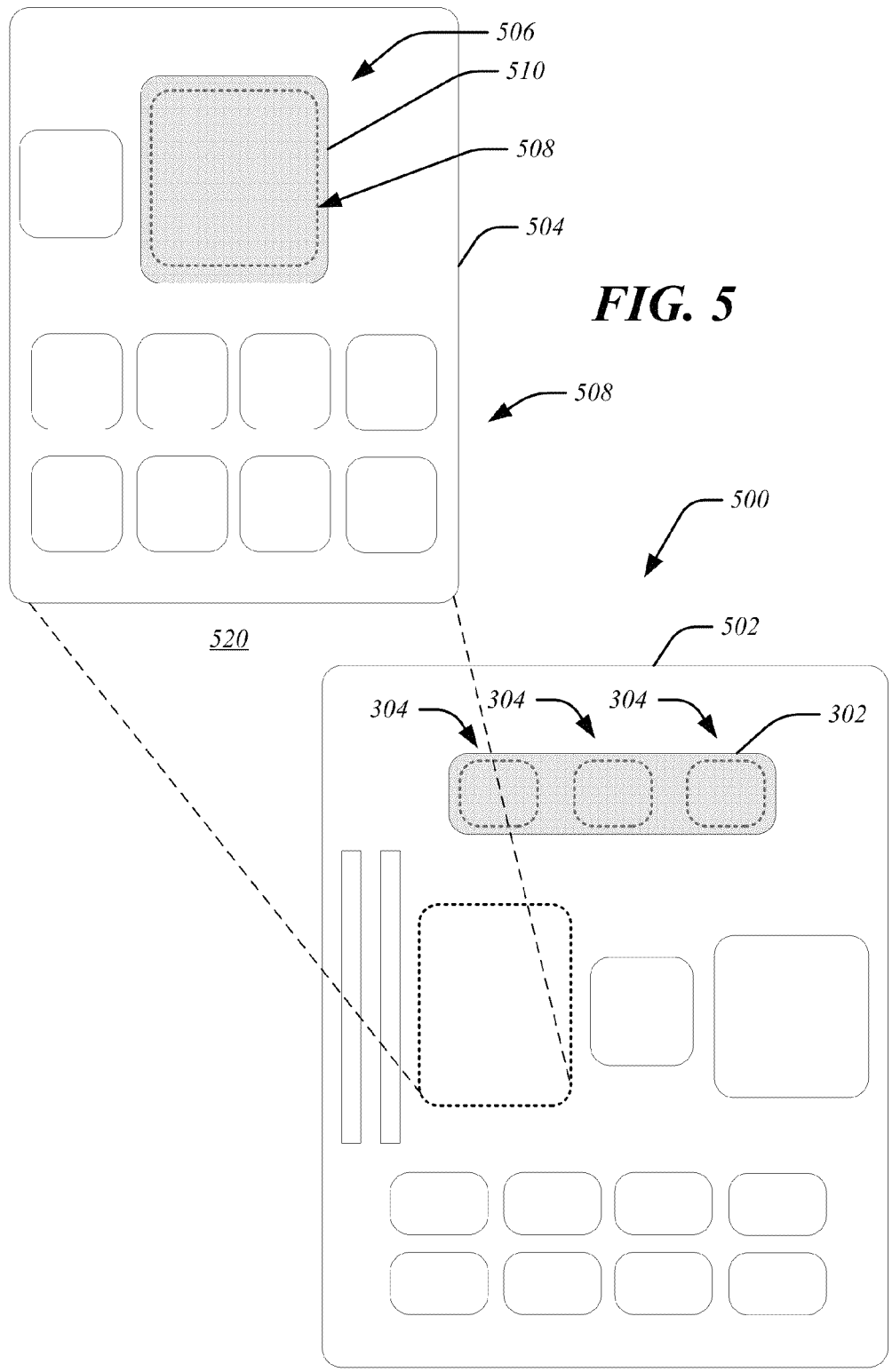
FIG. 5 depicts another example system.

As previously noted, in various embodiments, a thermal coating may be applied to an electrical component body when the electrical component body is mounted or bonded to another component, such as a PCB. In some embodiments, one or more electrical components that are coated with a thermal coating may be coupled to a first PCB that is itself coupled to another PCB. FIG. 5 depicts a system 500 that includes a first PCB 502. Coupled to the first PCB 502 is a second PCB 504, details of which are depicted in the expanded view 520. The first PCB 502 may include various electrical components including, among others, CPU(s), GPU(s), power devices, inductors, memory components, slots for coupling to other components, such as peripheral component interconnect (PCI) slots, and so forth.

In the particular example shown in FIG. 5, the first PCB 502 may include multiple electrical components 304 that are each covered by a thermal coating 302, as discussed previously. As further depicted in FIG. 5, the second PCB 504 may be coupled to the first PCB 502. In one example, the second PCB 504 may form a solid state drive (SSD) device that is used to store data in a non-volatile memory. The second PCB 504 may include, for example, integrated circuit devices, voltage regulators, a memory controller component 506, which is coupled to a solid state memory 508 to control reading and writing data to/from the memory 508. In the example shown, the memory controller component 506 may include a memory controller device 508 that is coated with a thermal coating 510.

The system 500 may be incorporated in various types of device, such as a computer, a desktop computer, or a mobile computing device. Examples of a mobile computing device may include an ultra-mobile personal computer, a tablet personal computer, touch pad, portable computer, handheld computer, palmtop computer, personal digital assistant (PDA), cellular telephone, combination cellular telephone/PDA, handheld television, smart device (e.g., smart phone, smart tablet or smart television), mobile internet device (MID), messaging device, data communication device, and so forth. The embodiments are not limited in this context.

In operation, the system 500 may be configured to run in different modes. For example, the electrical components 304 may operate circuitry under a first, active, mode of operation at a first clock frequency during which the power generated by the electrical components 304 may limit their heat output so that the temperature of the electrical components 304 and/or other components of PCB 502 does not exceed a design limit for that component. In a second, enhanced, mode of operation the clock frequency of circuitry of electrical components 304 may be increased such that the heat output from electrical components 304 causes a rise in temperature.

In various embodiments, the thermal coating 302 may be designed to limit the rise in temperature of components of PCB 502, including the electrical components 304, by providing a mPCM 114 that undergoes a phase transition at a temperature that is reached by the thermal coating 302 when the electrical components operate in the enhanced mode. For example, during operation in the active mode, the average heat generated by the electrical components 304 may be such that an average temperature of electrical components 304 ranges between about 30 to 40° C. During the enhanced mode of operation, the heat generated from the electrical components 304 may be such that the temperature of electrical components 304 rises to about 50° C. after about 10 seconds operation in the case where the electrical components are mounted to the PCB 502 without being coated with thermal coating 302. The temperature may continue to rise to 60° C. or higher if the duration of the operation in enhanced mode extends beyond 10 seconds. However, the component design for electrical components 304 and/or system design for PCB 502 may specify that temperature is not to exceed 60° C. Accordingly, it may be desirable to apply a thermal coating 302 to electrical components 304 that has a mPCM 114 that undergoes a phase transition, such as a melting transition, at a temperature lower than the temperature limit of 60° C., for example, about 50° C. In this manner, if the operation of electrical components 304 in enhanced mode is to exceed about 10 seconds, when the temperature of the thermal coating 304 reaches 50° C., a portion of the heat generated by the electrical components 304 is expended in the process of melting the mPCM 114, thereby attenuating the rise in temperature of the electrical components 304 and any components proximate the electrical components 304.

In a similar manner, components of second PCB 504, such as the memory controller 508, may operate in more than one mode. During operation in an enhanced mode excessive heat that is generated may be absorbed, at least in part, by the thermal coating 510 when the phase transition temperature of a mPCM incorporated into the thermal coating 510 is reached. Again, the phase transition temperature, such as the melting temperature of such a mPCM may be arranged to be below an upper limit (design limit) of temperature for components of the second PCB 504 thereby preventing or delaying a temperature rise beyond the design limit for the memory controller 508 and/or other components of second PCB 504.

Figure 6:
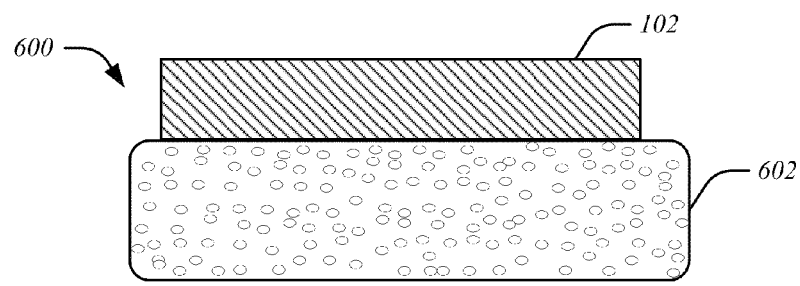
FIG. 6 illustrates depicts a further example system.

As noted previously, instead of applying a thermal coating to an electrical component body to increase the thermal time constant, the electrical component body may be directly mounted to a package that itself has similar structure and properties to a thermal coating. FIG. 6 illustrates a system 600 that includes the electrical component body 102, which is affixed to a packaging component 602 on one side of the electrical component body. In some embodiments, the packaging component 602 may be a composite that includes a matrix material and dispersed phase, such as a mPCM material as disclosed above with respect to the FIGS. 1-5. The packaging component 602 may thereby impart a longer thermal time constant to the electrical component body 102 similarly to that provided by the aforementioned thermal coatings.

In accordance with various embodiments, the transition temperature of a microencapsulated energy storage material, such as a micro encapsulated phase change material, may be tailored according to the type of component to be coated and the operation conditions to be managed. In some examples, the melting temperature of a mPCM material may be designed to fall in the range of 30° C. to 120° C. depending on the electrical component/operation conditions for which thermal protection is needed.

In the FIGS. 7 to 11 to follow, various experimental examples that document the advantages afforded by the present embodiments are provided. In particular, the increase in temperature caused by operation of electrical devices has been investigated for the case in which the current (power) output of the electrical devices is increased to emulate device behavior under an enhanced operation mode. The thermal behavior was studied for different locations on a PCB motherboard including the thermal behavior of three different power field effect transistors (FET) of a voltage regulator for a core processor. In particular, the temperature was measured as a function of time once a surge of power is applied to document the change in temperature under enhanced mode operation. In an initial set of measurements in which the power FETs were operated on the PCB motherboard without a thermal coating, temperature was measured at the three different power FETs and at three different locations proximate the respective power FETs. Subsequently, the three different power FETs were each coated with a thermal coating formed according to the present embodiments using a mPCM material dispersed within an epoxy matrix.

Figure 7:
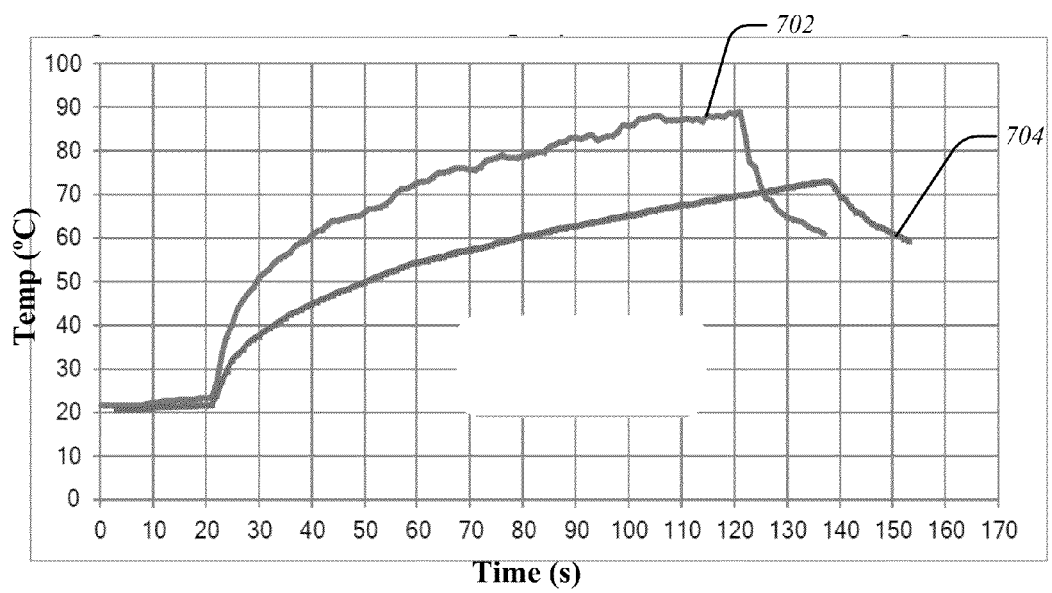
FIG. 7 illustrates experimental measurements of performance of an example system.

FIG. 7 is a graph that depicts the thermal behavior of a first power FET as a function of time. At a time corresponding to approximately 20 seconds, the power FET device is subjected to a surge in average device current (power) that corresponds to operating conditions that emulate an enhanced operation mode. At a predetermined time thereafter, the power is reduced. The curve 702 represents temperature as a function of time for the uncoated first power FET, while the curve 704 corresponds to the first power FET after coating with a thermal coating. The temperature rises in both cases after enhanced mode operations are initiated at 20 seconds. After the enhanced mode operation is terminated at a subsequent time, the temperature falls. Using the temperature of 60° C. as a reference temperature for comparison, in an uncoated state the first power FET reaches 60° C. in about 20 seconds after the power surge is applied, corresponding to time=40 seconds on the x-axis. After being coated with the thermal coating, the first power FET reaches a temperature of 60° C. in about 60 seconds after the power surge is applied.

Figure 8:
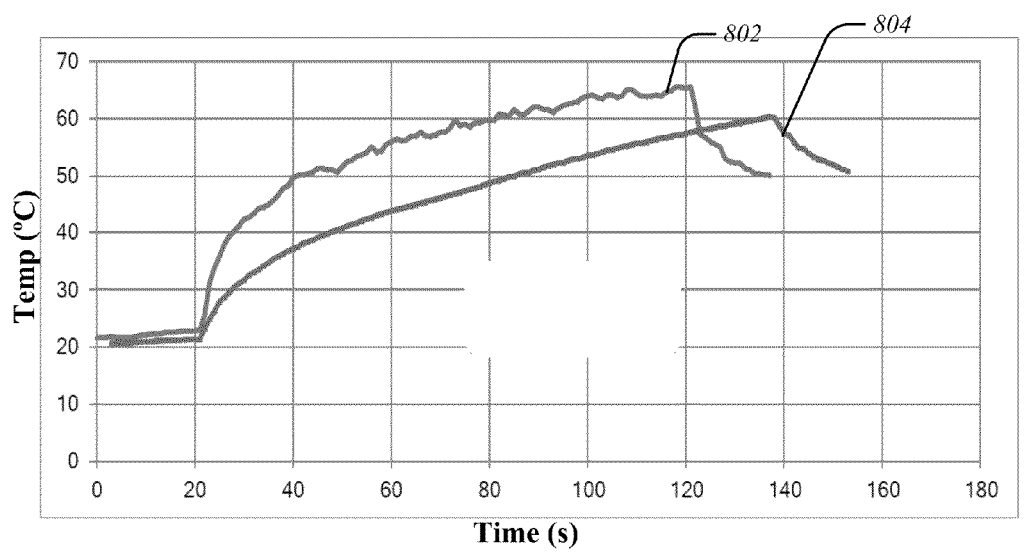
FIG. 8 illustrates additional experimental measurements of performance of an example system.

FIG. 8 is a graph that depicts the thermal behavior of a second power FET as a function of time. The curve 702 represents temperature as a function of time for the uncoated second power FET, while the curve 804 corresponds to the second power FET after coating with a thermal coating. As illustrated, in an uncoated state the second power FET reaches a temperature of 60° C. in about 60 seconds after the power surge is applied, corresponding to time=80 seconds on the x-axis. After being coated with the thermal coating, the second power FET reaches a temperature of 60° C. in about 120 seconds after the power surge is applied.

Figure 9:
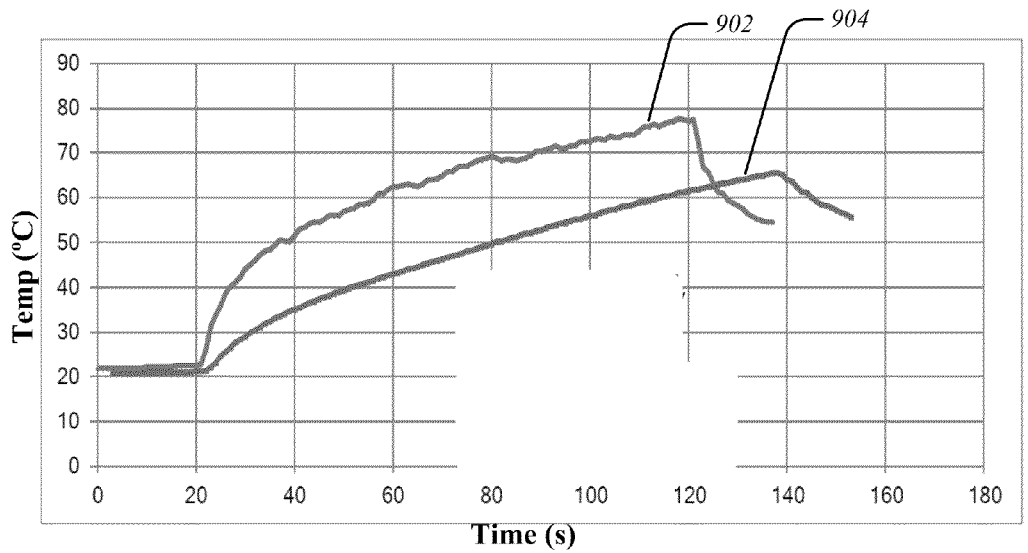
FIG. 9 illustrates other experimental measurements of performance of an example system.

FIG. 9 is a graph that depicts the thermal behavior of a third power FET as a function of time. The curve 902 represents temperature as a function of time for the uncoated third power FET, while the curve 904 corresponds to the third power FET after coating with a thermal coating. As illustrated, in an uncoated state the third power FET reaches a temperature of 60° C. in slightly less than 40 seconds after the power surge is applied, corresponding to time=56 seconds on the x-axis. After being coated with the thermal coating, the third power FET reaches a temperature of 60° C. in slightly less than 100 seconds after the power surge is applied.

Figure 10:
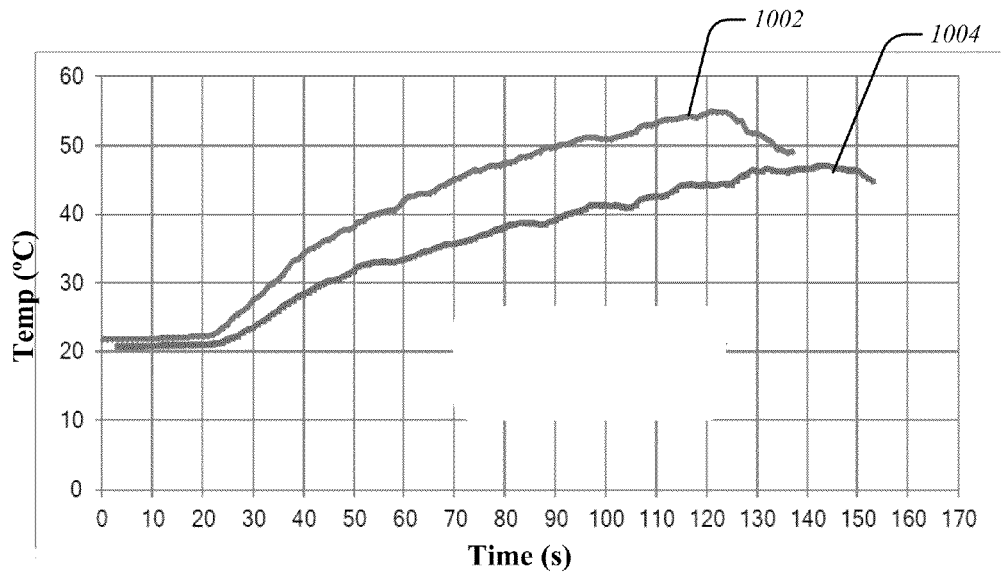
FIG. 10 illustrates still further experimental measurements of performance of an example system.

FIG. 10 is a graph that depicts the thermal behavior of a second region of a PCB near the second power FET as a function of time. The curve 1002 represents temperature as a function of time for the second region during operation of the uncoated second power FET, while the curve 1004 corresponds to temperature as a function of time for the second region during operation of the second power FET with a thermal coating. As shown, the temperature excursions after application of a power surge are less than in those illustrated in previous graphs. For purposes of comparison a temperature of 40° C. may be used. As illustrated, for an uncoated state of the power FET, the second region near the second power FET reaches a temperature of 40° C. in about 35 seconds after the power surge is applied, corresponding to time=55 seconds on the x-axis. After the second power FET is coated with the thermal coating, the second region near the second power FET reaches a temperature of 40° C. in about 75 seconds after the power surge is applied.

Figure 11:
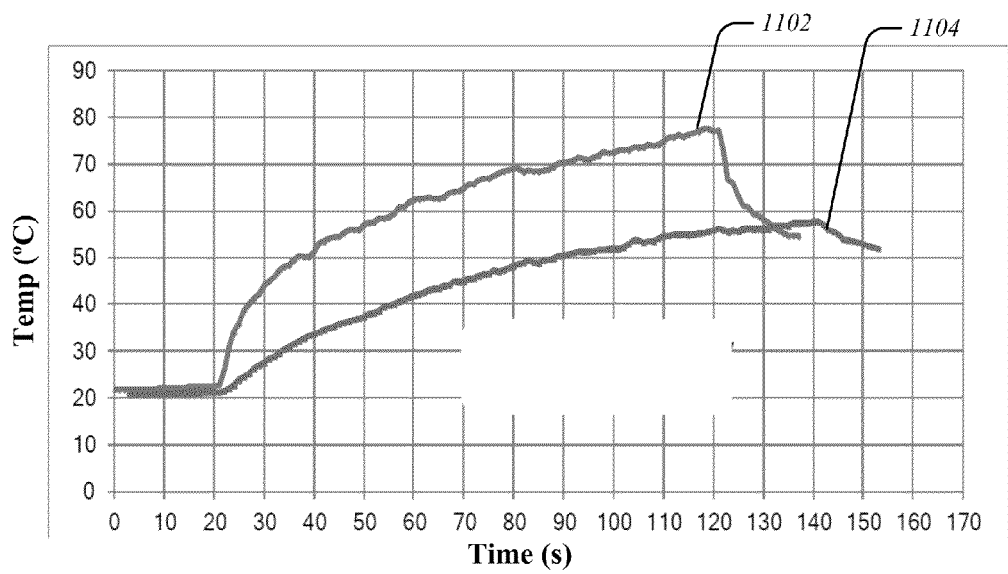
FIG. 11 illustrates yet other experimental measurements of performance of an example system.

Finally, FIG. 11 is a graph that depicts the thermal behavior of a third region of a PCB near the third power FET as a function of time. The curve 1102 represents temperature as a function of time for the third region during operation of the uncoated third power FET, while the curve 1104 corresponds to temperature as a function of time for the third region during operation of the third power FET with a thermal coating. As shown, the temperature excursions after application of a power surge are also less than in those illustrated in previous graphs for regions on the actual power FETs. For purposes of comparison a temperature of 50° C. may be used. As illustrated, for an uncoated state of the power FET, the third region near the third power FET reaches a temperature of 50° C. in about 20 seconds after the power surge is applied, corresponding to time=40 seconds on the x-axis. After the third power FET is coated with the thermal coating, the third region near the third power FET reaches a temperature of 50° C. in about 65 seconds after the power surge is applied.

As evident from the results presented in FIGS. 7 to 11, the fabrication of a power device with a thermal coating in accordance with the present embodiments increases the interval for reaching a given temperature, both in locations directly on the power device and in locations proximate the power device, such as on a PCB that supports the power device. Notably, for each of the three power FETs the time interval to reach 60° C. on the power FET starting from an initial temperature of about 20° C. increases by a factor of 2 or more. Moreover, for the two sites measured on the PCB near the respective power FETs the time interval to reach a respective comparison threshold temperature starting from an initial temperature of about 20° C. also increases by more than a factor of 2. Moreover, the absolute value of the difference in time to reach a threshold temperature on an uncoated power FET device as opposed to a power FET device having a thermal coating is about 40 to 60 seconds or more, illustrating that significant increases in the interval for operation at the higher power condition are achievable by fabrication of a power device with a thermal coating of the present embodiments.

Although the example data of FIGS. 7-11 is derived from power FET transistor devices, similar results may be expected for other devices that draw high power such as integrated voltage regulators, inductors, CPU chips, GPU chips, system-on-a-chip devices, communications chips, and so forth. Moreover, in further embodiments, thermal coatings, such as thermal coating 104, may be applied to other electrical or electronic components so as to increase the thermal time constant and thereby limit the temperature increase sustained when such components undergo brief periods of increased power.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 12:
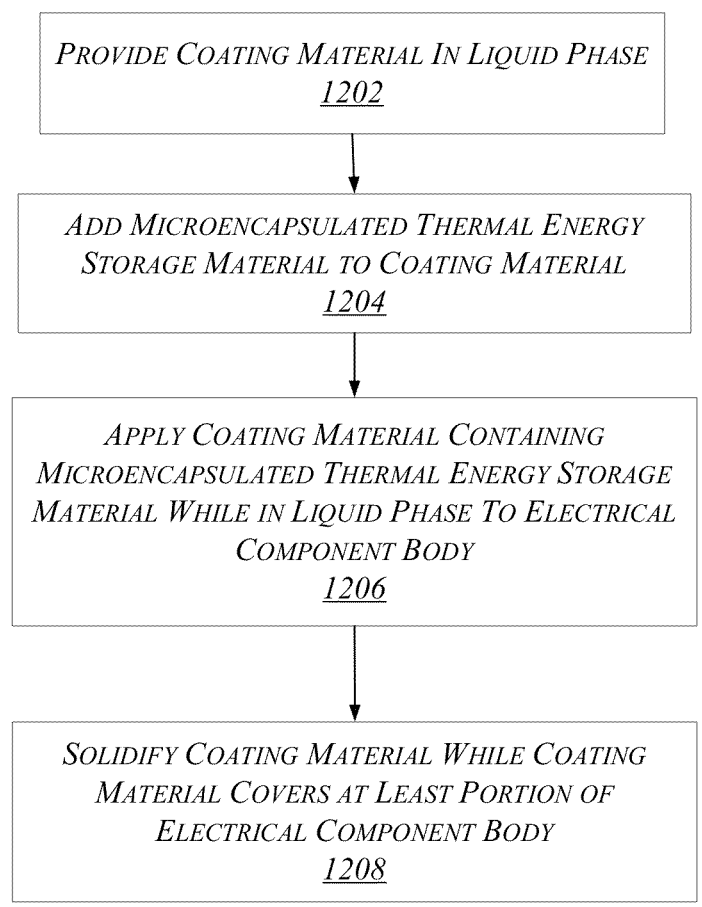
FIG. 12 illustrates an exemplary first logic flow.

FIG. 12 depicts an exemplary first logic flow 1200. At block 1202, a coating material is provided in liquid phase. In some cases, the coating material may be provided as more than one liquid component that form a liquid mixture of the multiple components. At block 1204, microencapsulated thermal energy storage material is added to the coating material in the liquid phase. In some cases, the microencapsulated thermal energy storage material may be a microencapsulated phase change material. The microencapsulated thermal energy storage material may be dispersed as microscopic particles within the liquid coating material.

At block 1206, the liquid coating material containing the microencapsulated thermal energy storage material is applied to an electrical component body. The electrical component body, may be, for example, a power device, such as a power transistor, inductor, processor, or other power device. In some examples, the liquid may be applied when it retains sufficient viscosity so as to remain on the electrical component body. In some examples, a containment structure, which may be temporary, may be placed around the electrical component body against a package or other structure that supports the electrical component body so as to form an open containment structure into which the liquid thermal coating may be dispensed.

At block 1208, the coating material containing microencapsulated thermal energy storage material is solidified while the coating material covers at least a portion of the electrical component body. The solidification may take place passively, for example, by the mere passage of time, or may be induced or accelerated by the use of a curing agent, elevated temperature, and so forth. In particular, the coating material may be operative to solidify while covering at least a portion of the electrical component body. For example, as applied, the coating material may have a combination of viscosity and surface tension that maintains the thermal coating material in contact with the electrical component body even while in liquid form. In some examples, the electrical component body may be mounted on a package, such as a PCB when the coating material is applied as a liquid. The coating material may subsequently solidify while covering an outer surface of the electrical component body that faces away from the PCB, and may extend over portions of the PCB proximate the electrical component body. In some examples in which the coating material forms a solid polymeric material, a curing agent, such as a UV curing agent may be included in the coating material to facilitate curing of the coating material and concomitant solidification. In other examples, heat may be applied to induce curing of the coating material. In cases where a containment structure is provided around the electrical component body, the containment structure may be optionally removed after solidification of the coating material.

FIG. 13 illustrates an embodiment of an exemplary computing architecture 1300 suitable for implementing various embodiments as previously described. As used in this application, the terms "system" and "component" are intended to refer to a computer-related entity, either hardware, a combination of hardware and software, software, or software in execution, examples of which are provided by the exemplary computing architecture 1300. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

In one embodiment, the computing architecture 1300 may comprise or be implemented as part of an electronic device. Examples of an electronic device may include without limitation a mobile device, a personal digital assistant, a mobile computing device, a smart phone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combination thereof. The embodiments are not limited in this context.

The computing architecture 1300 includes various common computing elements, such as one or more processors, co-processors, memory units, chipsets, controllers, peripherals, interfaces, oscillators, timing devices, video cards, audio cards, multimedia input/output (I/O) components, and so forth. The embodiments, however, are not limited to implementation by the computing architecture 1300.

As shown in FIG. 13, the computing architecture 1300 comprises a processing unit 1304, a system memory 1306 and a system bus 1308. The processing unit 1304 can be any of various commercially available processors. Dual microprocessors and other multi-processor architectures may also be employed as the processing unit 1304. The system bus 1308 provides an interface for system components including, but not limited to, the system memory 1306 to the processing unit 1304. The system bus 1308 can be any of several types of bus structure that may further interconnect to a memory bus (with or without a memory controller), a peripheral bus, and a local bus using any of a variety of commercially available bus architectures.

The computing architecture 1300 may comprise or implement various articles of manufacture. An article of manufacture may comprise a computer-readable storage medium to store logic. Embodiments may also be at least partly implemented as instructions contained in or on a non-transitory computer-readable medium, which may be read and executed by one or more processors to enable performance of the operations described herein. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like.

The system memory 1306 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. In the illustrated embodiment shown in FIG. 13, the system memory 1306 can include non-volatile memory 1310 and/or volatile memory 1312. A basic input/output system (BIOS) can be stored in the non-volatile memory 1310.

The computer 1302 may include various types of computer-readable storage media in the form of one or more lower speed memory units, including an internal hard disk drive (HDD) 1314, a magnetic floppy disk drive (FDD) 1316 to read from or write to a removable magnetic disk 1318, and an optical disk drive 1320 to read from or write to a removable optical disk 1322 (e.g., a CD-ROM or DVD); and a solid state drive (SSD) 1323 to read or write data to/from a non-volatile memory (NVM) 1325, including a NAND flash memory, phase change memory (PCM), a spin memory; phase change memory with switch (PCMS), magnetoresistive random access memory (MRAM), spin memory, nanowire memory, ferroelectric transistor random access memory (FeTRAM). The HDD 1314, FDD 1316, optical disk drive 1320, and solid state drive 1323 can be connected to the system bus 1308 by a HDD interface 1324, an FDD interface 1326, an optical drive interface 1328, and a solid state drive interface 1329, respectively. The HDD interface 1324 for external drive implementations can include at least one or both of Universal Serial Bus (USB) and IEEE 1394 interface technologies. The solid state drive interface 1329 may comprise any suitable interface for coupling to the host device, such as, for example, but not limited to, a serial advanced technology attachment (SATA) interface, a serial attached SCSI (SAS) interface, a universal serial bus (USB) interface, a peripheral control interface (PCI), or other suitable device interface.

The drives and associated computer-readable media provide volatile and/or nonvolatile storage of data, data structures, computer-executable instructions, and so forth. For example, a number of program modules can be stored in the drives and memory units 1310, 1312, including an operating system 1330, one or more application programs 1332, other program modules 1334, and program data 1336.

A user can enter commands and information into the computer 1302 through one or more wire/wireless input devices, for example, a keyboard 1338 and a pointing device, such as a mouse 1340. Other input devices may include a microphone, an infra-red (IR) remote control, a joystick, a game pad, a stylus pen, touch screen, or the like. These and other input devices are often connected to the processing unit 1304 through an input device interface 1342 that is coupled to the system bus 1308, but can be connected by other interfaces such as a parallel port, IEEE 1394 serial port, a game port, a USB port, an IR interface, and so forth.

A monitor 1344 or other type of display device is also connected to the system bus 1308 via an interface, such as a video adaptor 1346. In addition to the monitor 1344, a computer typically includes other peripheral output devices, such as speakers, printers, and so forth.

The computer 1302 may operate in a networked environment using logical connections via wire and/or wireless communications to one or more remote computers, such as a remote computer 1348. The remote computer 1348 can be a workstation, a server computer, a router, a personal computer, portable computer, microprocessor-based entertainment appliance, a peer device or other common network node, and typically includes many or all of the elements described relative to the computer 1302, although, for purposes of brevity, only a memory/storage device 1350 is illustrated. The logical connections depicted include wire/wireless connectivity to a local area network (LAN) 1352 and/or larger networks, for example, a wide area network (WAN) 1354. Such LAN and WAN networking environments are commonplace in offices and companies, and facilitate enterprise-wide computer networks, such as intranets, all of which may connect to a global communications network, for example, the Internet.

When used in a LAN networking environment, the computer 1302 is connected to the LAN 1352 through a wire and/or wireless communication network interface or adaptor 1356. The adaptor 1356 can facilitate wire and/or wireless communications to the LAN 1352, which may also include a wireless access point disposed thereon for communicating with the wireless functionality of the adaptor 1356.

When used in a WAN networking environment, the computer 1302 can include a modem 1358, or is connected to a communications server on the WAN 1354, or has other means for establishing communications over the WAN 1354, such as by way of the Internet. The modem 1358, which can be internal or external and a wire and/or wireless device, connects to the system bus 1308 via the input device interface 1342. In a networked environment, program modules depicted relative to the computer 1302, or portions thereof, can be stored in the remote memory/storage device 1350. It will be appreciated that the network connections shown are exemplary and other means of establishing a communications link between the computers can be used.

The computer 1302 is operable to communicate with wire and wireless devices or entities using the IEEE 802 family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity), WiMax, and Bluetooth™ wireless technologies. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

In one embodiment, an apparatus may include an electrical component body that is operative to vary power during operation. The apparatus may further include a thermal component in contact with at least a portion of the electrical component body, in which the thermal component comprises a matrix material, and a thermal energy storage material embedded in the matrix material to absorb heat generated by the electrical component body.

In another embodiment, the thermal component comprises a thermal coating comprising a solid thermoset material applied to the electrical component body in a liquid phase and containing an embedded microencapsulated thermal energy storage material.

Alternatively, or in addition, in another embodiment, the electrical component body and the thermal coating together may comprise a thickness of one millimeter to twenty millimeters.

Alternatively, or in addition, in another embodiment, the thermal component may comprise a volume of 0.1 to 1000 cubic centimeters.

Alternatively, or in addition, in another embodiment, the thermal component may comprise a microencapsulated thermal storage material of ten to eighty weight percent.

Alternatively, or in addition, in another embodiment, the thermal energy storage material may comprise capsules having a diameter of one to one thousand micrometers.

Alternatively, or in addition, in another embodiment, the microencapsulated thermal storage material may comprise a microencapsulated phase change material (PCM) having a melting temperature between 30° C. and 120° C.

Alternatively, or in addition, in another embodiment, the electrical component body may comprise a power transistor device, an inductor, an electronic processor, or a solid state controller.

Alternatively, or in addition, in another embodiment the thermal component comprises a package operable to support the electrical component body.

Alternatively, or in addition, in another embodiment the apparatus may comprise a larger thermal time constant than that of a device comprising the electrical component body without the thermal component.

In another embodiment, a method may include providing a coating material this is in a liquid phase, adding microencapsulated thermal energy storage material to the coating material to form a thermal coating material, and applying the thermal coating material while the thermal coating material is in the liquid phase to an electrical component body having electrical circuitry, where the thermal coating material is operative to solidify while covering at least a portion of the electrical component body so as to form an enhanced thermal time constant device.

In another embodiment, a method may include providing a matrix material in a liquid phase and adding thermal energy storage material to the matrix material to form a thermal component that comprises a composite material containing the thermal energy storage material as a dispersed phase. The method may further include joining the thermal component to an electrical component body to form an enhanced thermal time constant device.

In another embodiment, in another embodiment the method may include applying the thermal component as a thermal coating in a liquid phase, the thermal coating material being operative to solidify while covering at least a portion of the electrical component body.

Alternatively, or in addition, in another embodiment the method may include: forming a containment structure on the package that surrounds the electrical component body; and applying the coating material in liquid form to the electrical component body and portions of the package within an area defined by the containment structure.

Alternatively, or in addition, in another embodiment the method may include applying the thermal component as a liquid thermoset material and applying one or more of elevated temperature or ultraviolet radiation to the liquid thermoset material to cure the liquid thermoset material.

Alternatively, or in addition, in another embodiment the method may include operating the enhanced thermal constant device at a set of conditions, where the set of conditions is operative to generate a first temperature in the enhanced thermal time constant device that is less than a second temperature generated when the electrical component body is operated under the set of conditions without being joined to the thermal component Alternatively, or in addition, in another embodiment the method may include operating the enhanced thermal time constant device at a first frequency, increasing operating frequency of the enhanced thermal time constant device for the first duration from the first frequency to a second frequency, and; decreasing the operating frequency of the enhanced thermal time constant device from the second frequency to the first frequency.

Alternatively, or in addition, in another embodiment the method may include adding microencapsulated phase change material (PCM) to the matrix material to form a thermal component comprising a thermal coating material that has ten to eighty weight percent microencapsulated thermal energy storage material.

Alternatively, or in addition, in another embodiment the microencapsulated thermal energy storage material may have a melting temperature in between 30° C. and 120° C.

Alternatively, or in addition, in another embodiment the method may include coupling the electrical component body to a package comprising the thermal component.

Alternatively, or in addition, in another embodiment the method may include bonding the package to a printed circuit board.

In another embodiment, a system may include a battery and an electrical component body arranged to receive current from the battery, the electrical component body operative to vary power during operation. The system may also include a thermal component in contact with at least a portion of the electrical component body, where the thermal component comprises a matrix material, and a thermal energy storage material embedded in the matrix material to absorb heat generated by the electrical component body.

In another embodiment, the thermal component may comprise a thermal coating comprising a solid thermoset material applied to the electrical component body in a liquid phase and containing an embedded microencapsulated thermal energy storage material.

Alternatively, or in addition, in another embodiment the electrical component body and the thermal component together comprise a thickness of one millimeter to 20 millimeters.

Alternatively, or in addition, in another embodiment the thermal coating comprising a volume of 0.1 to 1000 cubic centimeters.

Alternatively, or in addition, in another embodiment the thermal component comprises a microencapsulated thermal storage material of ten to eighty weight percent.

Alternatively, or in addition, in another embodiment the thermal energy storage material comprises capsules having a diameter of one to one thousand micrometers.

Alternatively, or in addition, in another embodiment the thermal energy storage material comprises a microencapsulated phase change material (PCM) having a melting temperature between 30° C. and 120° C.

Alternatively, or in addition, in another embodiment the electrical component body comprising a power transistor device, an inductor, an electronic processor, or a solid state controller.

Alternatively, or in addition, in another embodiment the thermal component comprises a package operable to support the electrical component body.

Alternatively, or in addition, in another embodiment the system comprises a larger thermal time constant than that of a device comprising the electrical component body without the thermal component.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "second," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a computer-readable medium or article which may store an instruction or a set of instructions that, if executed by a computer, may cause the computer to perform a method and/or operations in accordance with the embodiments. Such a computer may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
an electrical component body, the electrical component body operative to vary power during operation, the electrical component body comprising an upper surface and a plurality of side surfaces; and
a thermal component in contact with the upper surface and the plurality of side surfaces of the electrical component body, the thermal component having a first thickness proximate to the upper surface and a second thickness proximate to the plurality of side surfaces, the thermal component comprising:
a matrix material having a first melting temperature; and
a microencapsulated phase change material (mPCM) embedded in the matrix material to absorb heat generated by the electrical component body, the mPCM including a number of particles, each particle comprising an amount of a thermal energy storage material covered with an encapsulant material, the thermal energy storage material having a second melting temperature, the second melting temperature being lower than the first melting temperature, the encapsulant material having a third melting temperature, the third melting temperature being higher than the second melting temperature and lower than the first melting temperature, the mPCM having a diameter less than $1/10^{th}$ the second thickness.

2. The apparatus of claim 1, the electrical component body and the thermal component together comprising a thickness of one millimeter to 20 millimeters.

3. The apparatus of claim 1, the thermal component comprising a volume of 0.1 to 1000 cubic centimeters.

4. The apparatus of claim 1, the thermal component comprising the mPCM of between 10-20 weight percent.

5. The apparatus of claim 1, the mPCM having a melting temperature between 30° C. and 120° C.

6. The apparatus of claim 1, the electrical component body comprising a power transistor device, an inductor, an electronic processor, or a solid state controller.

7. The apparatus of claim 1, the thermal component comprising a package operable to support the electrical component body.

8. The apparatus of claim 1, wherein the apparatus has a larger thermal time constant than that of a device comprising the electrical component body without the thermal component.

9. A method comprising:
providing a matrix material in a liquid phase, the matrix material having a first melting temperature;
adding a microencapsulated phase change material (mPCM) to the matrix material to form a thermal component that comprises a composite material containing the mPCM as a dispersed phase, the mPCM including a number of particles, each particle comprising an amount of a thermal energy storage material covered with an encapsulant material, the thermal energy storage material having a second melting temperature, the second melting temperature being lower than the first melting temperature, the encapsulant material having a third melting temperature, the third melting temperature being higher than the second melting temperature and lower than the first melting temperature; and
joining the thermal component to an electrical component body to form an enhanced thermal time constant device, the electrical component body comprising an upper surface and a plurality of side surfaces, the thermal component to substantially cover the upper surface and to cover at least a portion of the plurality of side surfaces, the thermal component having a first thickness proximate to the upper surface and a second thickness proximate to the plurality of side surfaces, the mPCM having a diameter less than $1/10^{th}$ the second thickness.

10. The method of claim 9, comprising applying the thermal component as a thermal coating in a liquid phase, the thermal coating material being operative to solidify while covering at least a portion of the electrical component body.

11. The method of claim 10, comprising:
forming a containment structure on a package that surrounds the electrical component body; and
applying the coating material in liquid form to the electrical component body and portions of the package within an area defined by the containment structure, the applied coating material encapsulating the electrical component body.

12. The method of claim 9, comprising:
applying the thermal component as a liquid thermoset material; and applying one or more of elevated temperature or ultraviolet radiation to the liquid thermoset material to cure the liquid thermoset material.

13. The method of claim 9, comprising:
operating the enhanced thermal constant device at a set of conditions, the set of conditions operative to generate a first temperature in the enhanced thermal time constant device that is less than a second temperature generated when the electrical component body is operated under the set of conditions without being joined to the thermal component.

14. The method of claim 13 comprising
operating the enhanced thermal time constant device at a first frequency;
increasing operating frequency of the enhanced thermal time constant device for the first duration from the first frequency to a second frequency; and
decreasing the operating frequency of the enhanced thermal time constant device from the second frequency to the first frequency.

15. The method of claim 9, wherein the thermal component comprises a thermal coating material that has ten to twenty weight percent mPCM.

16. The method of claim 15, the microencapsulated thermal energy storage material having a melting temperature in between 30° C. and 120° C.

17. The method of claim 9, comprising bonding the electrical component body to a printed circuit board.

18. A system, comprising:
a battery;
an electrical component body arranged to receive current from the battery, the electrical component body operative to vary power during operation, the electrical component body comprising an upper surface and a plurality of side surfaces; and
a thermal component in contact with the upper surface and the plurality of side surfaces of the electrical component body, the thermal component having a first thickness proximate to the upper surface and a second thickness proximate to the plurality of side surfaces, the thermal component comprising:
a matrix material having a first melting temperature; and
a microencapsulated phase change material (mPCM) embedded in the matrix material to absorb heat generated by the electrical component body, the mPCM including a number of particles, each particle comprising an amount of a thermal energy storage material covered with an encapsulant material, the thermal energy storage material having a second melting temperature, the second melting temperature being lower than the first melting temperature, the encapsulant material having a third melting temperature, the third melting temperature being higher than the second melting temperature and lower than the first melting temperature, the mPCM having a diameter less than $1/10^{th}$ the second thickness.

19. The system of claim 18, the thermal component comprising a thermal coating comprising a solid thermoset material applied to the electrical component body in a liquid phase and containing an embedded microencapsulated thermal energy storage material, the thermal coating operative to encapsulate the electrical component body.

20. The system of claim 18, the electrical component body and the thermal component together comprising a thickness of one millimeter to 20 millimeters.

21. The system of claim 19, the thermal coating comprising a volume of 0.1 to 1000 cubic centimeters.

22. The system of claim 18, the thermal component comprising the mPCM of between 10-20 weight percent.

23. The system of claim 18, the thermal energy storage material comprising capsules having a diameter of one to one thousand micrometers.

24. The system of claim 18, the mPCM having a melting temperature between 30° C. and 120° C.

25. The system of claim 18, the electrical component body comprising a power transistor device, an inductor, an electronic processor, or a solid state controller.

26. The system of claim 18, the thermal component comprising a package operable to support the electrical component body.

27. The system of claim 18, wherein the system has a larger thermal time constant than that of a device comprising the electrical component body without the thermal component.

\* \* \* \* \*